(12) United States Patent
Ochiai et al.

(10) Patent No.: US 6,596,094 B2
(45) Date of Patent: Jul. 22, 2003

(54) SOLDER PASTE AND ELECTRONIC DEVICE

(75) Inventors: Masayuki Ochiai, Kawasaki (JP);
Yasuo Yamagishi, Kawasaki (JP);
Hiroki Uchida, Kawasaki (JP);
Masayuki Kitajima, Kawasaki (JP);
Masakazu Takesue, Kawasaki (JP);
Tadaaki Shono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/993,615

(22) Filed: Nov. 27, 2001

(65) Prior Publication Data

US 2002/0102432 A1 Aug. 1, 2002

(30) Foreign Application Priority Data

Nov. 28, 2000 (JP) .......................................... 2000-361873
Aug. 27, 2001 (JP) .......................................... 2001-256218

(51) Int. Cl.[7] ............................................. B23K 35/363
(52) U.S. Cl. ............................. 148/23; 148/24; 428/553
(58) Field of Search ........................ 148/23, 24; 428/553

(56) References Cited

U.S. PATENT DOCUMENTS

| | | | | |
|---|---|---|---|---|
| 4,460,414 A | * | 7/1984 | Hwang | .......................... 148/23 |
| 5,698,160 A | * | 12/1997 | Chen et al. | .................. 420/557 |
| 6,159,304 A | * | 12/2000 | Noguchi et al. | ............... 148/23 |
| 6,440,228 B1 | * | 8/2002 | Taguchi et al. | ............... 148/225 |

FOREIGN PATENT DOCUMENTS

| | | | | |
|---|---|---|---|---|
| EP | 0931622 A1 | * | 2/1999 | ......... B23K/35/363 |
| GB | 2148626 A | * | 5/1985 | .......... H01H/85/06 |
| JP | 2000-158179 | | 6/2000 | |

* cited by examiner

*Primary Examiner*—Daniel J. Jenkins
(74) *Attorney, Agent, or Firm*—Armstrong, Westerman & Hattori, LLP

(57) ABSTRACT

A solder paste, includes a flux, a solder alloy particle scattered or mixed in the flux and including Sn and Zn as composition elements, and a metal particle scattered or mixed in the flux and including an element in the IB group in the periodic table as a composition element.

21 Claims, 7 Drawing Sheets

SOLDER PASTE AND ELECTRONIC DEVICE

BACKGROUND OF THE INVENTION

1. Field of the Invention

The present invention generally relates to electronic devices, and more particularly, to an electronic device including a part processed by a solder-paste and solder-packaging.

2. Description of the Related Art

Soldering is utilized for packaging parts on a substrate with respect to various electronic devices. Particularly, a surface mount technology has been utilized in recent electronic devices in order to realize high-density implementation of parts on a wiring substrate. A solder paste is used for the surface mount of parts.

The solder paste is a material typically obtained by mixing solder alloy particles with a flux vehicle containing rosin, organic solvents, thixotropic agents, and activators. The solder paste is usually screen-printed on the wiring substrate when it is used. While the mixture ratio of ingredients of the solder paste varies depending on the type of the solder alloy composition, a typical ratio between the solder alloy particles and the flux vehicle is roughly nine to one in weight.

The solder alloy particles are manufactured by a gas atomize method, a disk atomize method or the like for pulverizing melting solder into particles. For instance, the solder alloy particles having a grain diameter of 20–40 μm are utilized for packaging of quad flat package (QFP) having a pitch of 0.5 mm.

Conventionally, an alloy in a Sn (tin)—Pb (lead) system was generally utilized as the solder alloy. However, because the Pb has a toxicity, a Pb-free solder alloy such as an alloy in a Sn—Ag—Cu system or an alloy in a Sn—Zn (zinc)—Bi (bismuth) system has been used recently. An alloy having the composition of Sn-3.0 Ag-0.5 Cu, namely an alloy including Ag of 3 mass % of and Cu of 0.5 mass %, is used as the alloy in the Sn—Ag—Cu system. An alloy having the composition of Sn-8 Zn-3 Bi, namely an alloy including Zn of 8 mass % and Bi of 3 mass %, is utilized as the alloy in the Sn—Zn—Bi system.

However, the above-mentioned alloy in the Sn—Ag—Cu system has a melting point of 218° C. while the melting point of a conventional solder alloy in the Sn—Pb system has a melting point of 183° C. That is, the melting point of the alloy in the Sn—Ag—Cu system is 35° C. higher than the melting point of the conventional solder alloy in the Sn—Pb system. Hence, there is a risk of damaging the parts during reflow soldering process with Sn—Ag—Cu solder. Therefore, it is required for designing a printed wiring board that parts having low heat resistance be arranged close to parts having a large heat capacity. Furthermore, if the solder alloy in the Sn—Ag—Cu system is used, it is necessary to heighten the soldering temperature, as the melting point of the solder is higher than that of conventional solder. Therefore, it may be necessary to renew a furnace for uniform heating if the solder alloy in the Sn—Ag—Cu system is to be used.

On the other hand, the above-mentioned solder alloy in the Sn—Zn—Bi system has a melting point of 193° C. This melting point is only 10° C. higher than a melting point of a conventional solder in the Sn—Pb system, namely 183° C. Therefore, there is no disadvantage regarding the heat resistance of the parts. Hence, it may be possible to keep utilizing the conventional equipment for soldering when the solder alloy in the Sn—Zn—Bi system is used.

FIG. 1 is a view illustrating a conventional soldering process in which the solder alloy in a Sn—Zn—Bi system is used.

Referring to FIG. 1-(A), a copper (Cu) wiring pattern 11 is formed on a printed wiring board forming an electronic device. A solder paste 13 is screen-printed on the Cu wiring pattern 11. The solder paste 13 includes solder alloy particles 12 in the Sn—Zn—Bi system. A lead terminal 14 of the QFP is mounted on the solder paste 13. The solder alloy particles 12 are heated at a temperature of approximately 210° C. that is higher than the solder melting point of 193° C., thereby the solder alloy particles 12 are melted and the solder alloy layer 12A is formed as shown in FIG. 1-(B).

When the Cu wiring pattern 11 of the electronic device is soldered by such the solder alloy in the Sn—Zn—Bi system, a Zn—Cu compound layer 11A is apt to be formed on an interface between the solder alloy layer 12A and the Cu wiring pattern 11. This is because there is a high affinity between Zn and Cu.

The Zn—Cu compound layer 11A grows as time passes, as shown in FIG. 1-(C), because of the solid-phase-diffusing of Zn in the solder alloy layer 12A. During actual device operation, the electronic device generally has a temperature of approximately 80° C. Therefore, a heat stress accompanying such a temperature increase promotes the solid-phase-diffusing of Zn in the solder alloy layer 12A.

When the Zn—Cu compound layer 11A is grown thick on the interface between the Cu wiring pattern 11 and the solder alloy layer 12, bonding strength of the Zn—Cu compound layer 11A and the solder alloy layer 12 is reduced. Hence, breaking between the Zn—Cu compound layer 11A and the solder alloy layer 12, is apt to occur as shown in FIG. 2, and thereby the bonded lead terminal is separated from the substrate.

SUMMARY OF THE INVENTION

Accordingly, it is a general object of the present invention is to provide a novel and useful solder paste and electric device in which one or more of the problems described above are eliminated.

Another and more specific object of the present invention is to provide a solder paste which can provide enduring stability for a solder part for which a Pb free solder in a Sn—Zn system is used, and an electronic device having such a solder part.

The above objects of the present invention are achieved by a solder paste, including a flux, a solder alloy particle scattered or mixed in the flux and including Sn and Zn as composition elements, and a metal particle scattered or mixed in the flux and including an element in the IB group in the periodic table as a composition element. The above objects of the present invention are also achieved by an electronic device, including a terminal of which at least a surface is made of Cu, and a solder layer covering the terminal and including a solder alloy including Sn and Zn as composition elements, and a particle having a diameter of 5 μm or more and including an element in the IB group as a composition element.

According to the above invention, the alloy particles are scattered or mixed in the flux of the solder paste, with the particles including an element in the IB group as a composition element. Accordingly, after soldering is completed, it is possible to fix Zn on the particles including the element in the IB group. Hence, as a result of this, it is possible to decrease a reduction of the strength of the soldering part. It may be possible to select Cu, Au, or Ag as the element in the IB group.

Other objects, features, and advantages of the present invention will be more apparent from the following detailed description when read in conjunction with the accompanying drawings.

DETAIL DESCRIPTION OF THE PREFERRED EMBODIMENTS

A description will now be given, with reference to the drawings, of embodiments of the present invention.

Figure 1:
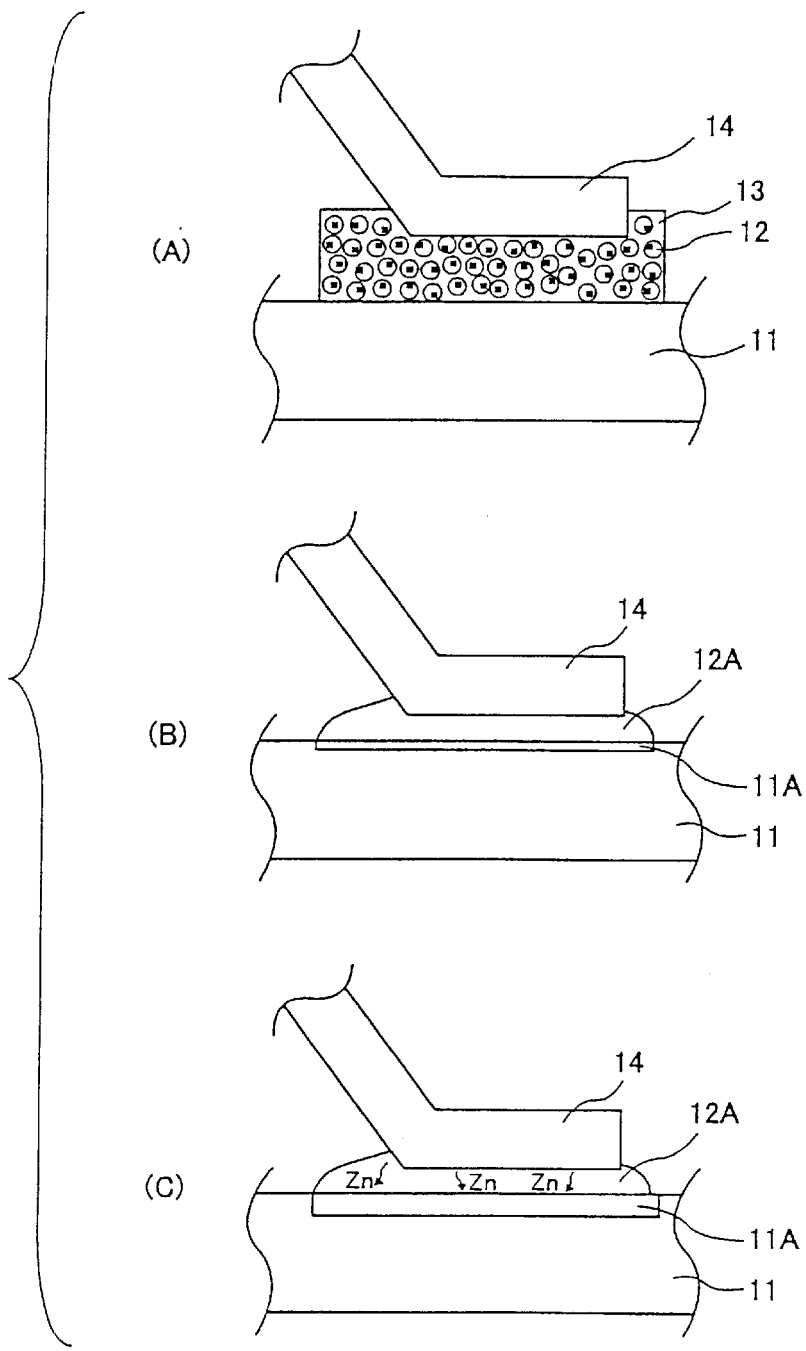
FIG. 1 is a view illustrating a conventional soldering process in which the solder alloy in a Sn—Zn—Bi system is used.
Figure 2:
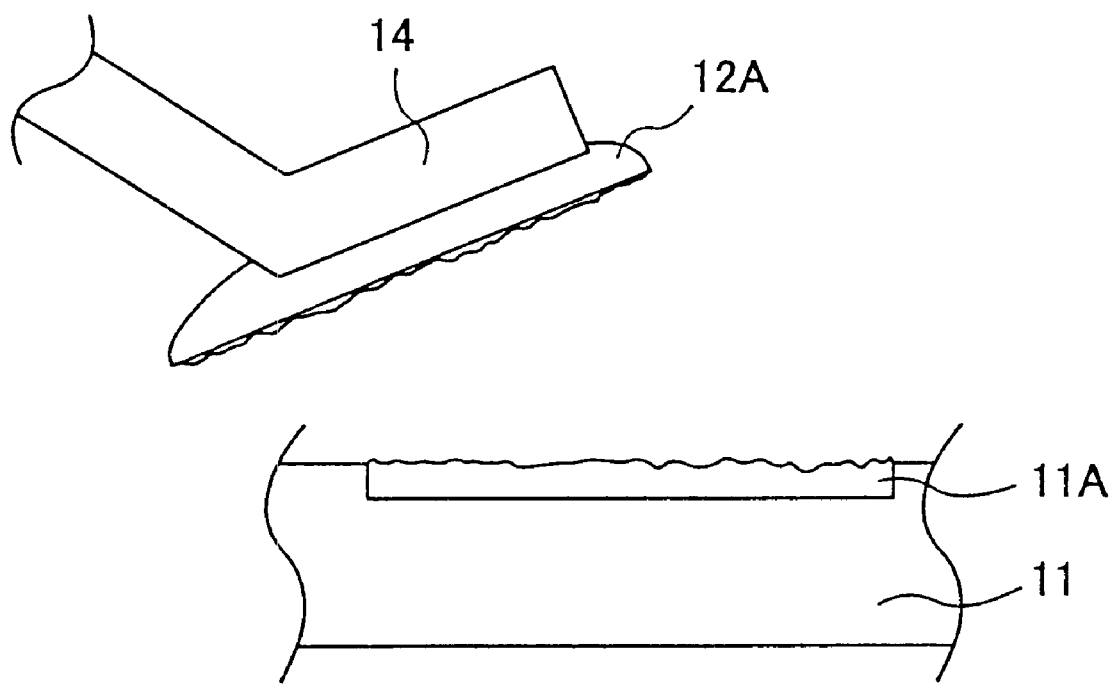
FIG. 2 is a view for explaining of a disadvantage in a conventional soldering process.
Figure 3:
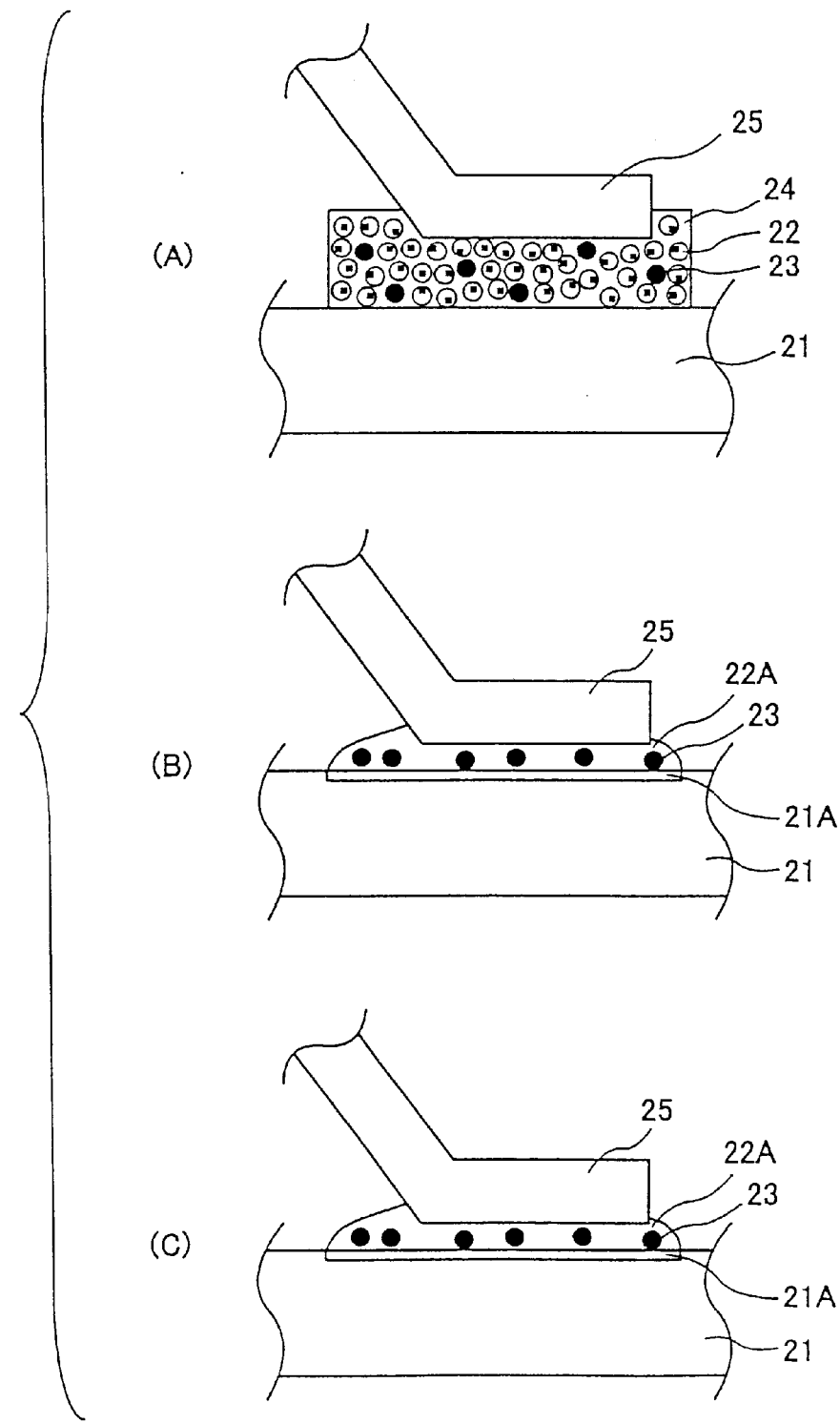
FIG. 3 is a view for showing a soldering process according to the first embodiment of the present invention.

FIG. 3 is a view for showing a soldering process according to a first embodiment of the present invention.

Referring to FIG. 3-(A), a solder paste is formed on a Cu wiring pattern 21 of a print circuit board forming an electronic device, by a screen-printing in which a metal mask is used. The solder paste is a mixture of Pb free solder alloy particles 22 in a Sn—Zn system and a general flux 24 comprised of rosin, organic solvents, thixotropic agents, and activators. The Pb free solder alloy particles 22 in the Sn—Zn system has a grain diameter of 20–40 μm and a composition of Sn-8 Zn-3 Bi in which Sn of 89 mass %, Zn of 8 mass %, and Bi of 3 mass % are included.

In this embodiment, metal particles 23 are scattered or mixed in the flux 24 in addition to the alloy particles 22. The metal particles 23 are made of Cu and have a diameter of 5–40 μm, preferably 20–40 μm the same size as the diameter of the solder alloy particles 22.

In the process shown in FIG. 3-(A), a part is mounted on the solder paste which is screen-printed, and a lead terminal 25 of the part is fixed on the solder paste.

In the process shown in FIG. 3-(B) following the process shown in FIG. 3-(A), a structure shown in FIG. 3-(A) is heated at a temperature of approximately 215° C. Under the anti-oxidation effect of the flux 24, a solder alloy layer 22A is formed by melting the solder alloy particles 22. In this case, Zn in the solder alloy particles and Cu in the wiring pattern 21 react together, and thereby a thin Zn—Cu compound layer 21A is formed on a surface of the wiring pattern 21.

In the process shown in FIG. 3-(C) following the process shown in FIG. 3-(B), an actual structure shown in FIG. 3-(B) was kept at a temperature of 150° C. for 100–150 hours. After the process shown in FIG. 3-(C), a cross section of a solder connecting part including the solder alloy layer 22A was observed by a microscope.

A composition of the flux 24 utilized in this embodiment is shown in TABLE 1. A composition of the solder alloy particles 22 are shown in TABLE 2. A composition of the metal particles 23 are shown in TABLE 3. Compositions of solder pastes (a)–(f) used in this embodiment are shown in TABLE 4. Here, the composition (f) in TABLE 4 is a composition of a conventional solder paste which does not include the metal particles 23.

As shown in TABLE 1, the flux used in this embodiment is a standard flux including rosin of 60 mass part, organic solvents of 36 mass part, thixotropic agents of 3 mass part, and activators of 1 mass part.

As shown in TABLE 2, solder alloy compositions in a Sn—Zn system of No. 1-3 were used in this embodiment. As a composition of No. 1, Sn of 92 mass %, Zn of 4 mass %, and Bi of 4 mass % were used. As a composition of No. 2, Sn of 91 mass % and Zn of 9 mass % were used. As a composition of No. 3, Sn of 89 mass %, Zn of 8 mass %, and Bi of 3 mass % were used.

As shown in TABLE 3, as a test material No. 1, pure Cu particles plated by tin were used. As a test material No. 2, pure Cu particles whose surface was chelate-processed were used. As a test material No. 3, alloy particles having a composition of Sn of 90 mass % and Cu of 10 mass % were used. As a test material No. 4, alloy particles having a composition of Cu of 64 mass % and Zn of 34 mass % were utilized. As a test material No. 5, alloy particles having a composition of Zn of 90 mass % and Ag of 10 mass % used.

As shown in TABLE 4, in this embodiment, respective solder paste test materials (a)–(f) were formed by mixing the flux 24, the solder alloy particles 22 and the metal particles 23 in a ratio shown in TABLE 4. Each of the solder paste test materials (a)–(e) includes the metal particles 23. The solder paste test material (f) is a material for paring to test materials (a)–(e) and does not include the metal particles 23.

TABLE 1

| Ingredient of Flux | |
| --- | --- |
| Rosin | 60 Mass Part |
| Solvents | 36 Mass Part |
| Thixotropic Agents | 3 Mass Part |
| Activators | 1 Mass Part |

TABLE 2

| Solder Particles Including Sn and Zn | | |
| --- | --- | --- |
| No. | Composition (mass %) | Melting Point (° C.) |
| 1 | Sn-4Zn-4Bi | 206 |
| 2 | Sn-9Zn | 199 |
| 3 | Sn-8Zn-3Bi | 193 |

TABLE 3

| Metal Particles Including an Element in IB group | | |
| --- | --- | --- |
| No. | Composition (mass %) | Surface-Covering |
| 1 | Pure Cu | Sn Plating |
| 2 | Pure Cu | Chelate-Process |
| 3 | Sn-10Cu | — |
| 4 | Cu-34Zn (C 2680) | — |
| 5 | Sn-10Ag | — |

TABLE 4

| | Composition of Solder Paste | |
|---|---|---|
| (a) | Sn-8Zn-3Bi Particles | 80 Mass Part |
| | Cu-34Zn Particles | 8 Mass part |
| | Ingredient of Flux | 12 Mass part |
| (b) | Sn-9Zn Paricles | 80 Mass Part |
| | Pure Cu Particles (Chelete Process) | 8 Mass part |
| | Ingredient of Flux | 12 Mass part |
| (c) | Sn-4Zn-2Bi Particles | 80 Mass Part |
| | Sn-10Cu Particles | 8 Mass part |
| | Ingredient of Flux | 12 Mass part |
| (d) | Sn-8Zn-3Bi Particles | 80 Mass Part |
| | Pure Cu Particles (Sn Plating) | 8 Mass part |
| | Ingredient of Flux | 12 Mass part |
| (e) | Sn-4Zn-2Bi Particles | 80 Mass Part |
| | Sn-10Ag Particles | 8 Mass part |
| | Ingredient of Flux | 12 Mass part |
| (f) | Sn-8Zn-3Bi Particles | 90 Mass Part |
| | Ingredient of Flux | 10 Mass Part |

Figure 4:
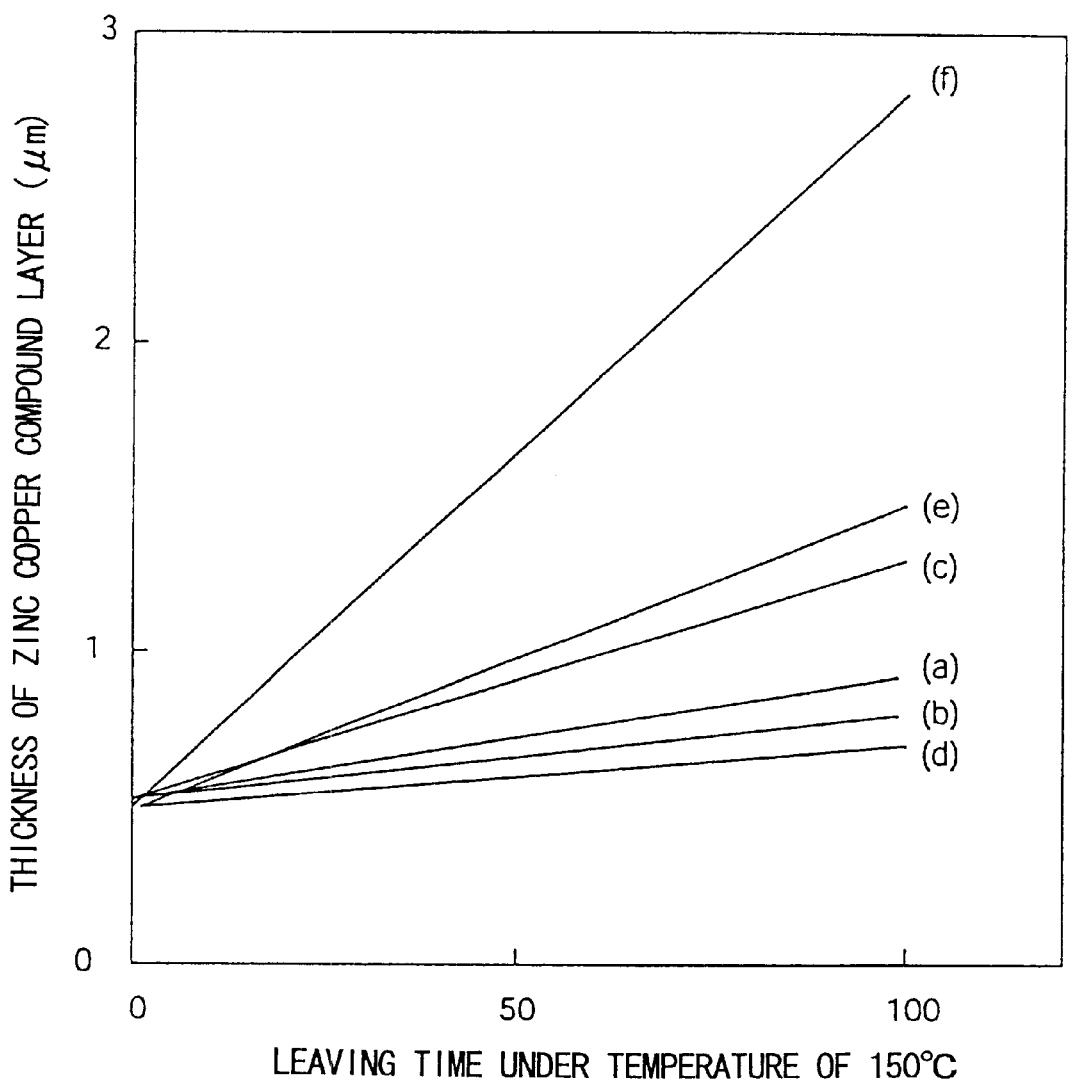
FIG. 4 is a chart showing an effect of a soldering process shown in FIG. 3-(C)

FIG. 4 is a chart showing an effect of a soldering process shown in FIG. 3-(C),i.e., showing the a relationship between a thickness of Zn—Cu compound layer 21A and process time, following the heating process with a temperature of 150° C.

As shown in FIG. 4, when the test materials (a), (b), and (d) were used, the respective Zn—Cu compound layers 21A did not reach a thickness of 1 μm even after solder bonding parts of the test materials (a), (b), and (d) were left for 100 hours at a temperature of 150° C. Therefore, the solder bonding part maintained an initial bonding strength. While the Zn—Cu composition layers 21A did not reach a thickness of 1.5 μm when test materials (e) and (c) were used, the Zn—Cu composition layer 21A of a test material (f) almost reached a thickness of 3 μm when the test material (f) which did not include the metal particles 23 in the solder paste was used.

Thus, it is possible to avoid effectively a decline of strength of the solder bonding part made of the Pb free solder in the Sn—Zn system, by employing the metal particles 23 that include Cu as the solder paste.

Figure 5:
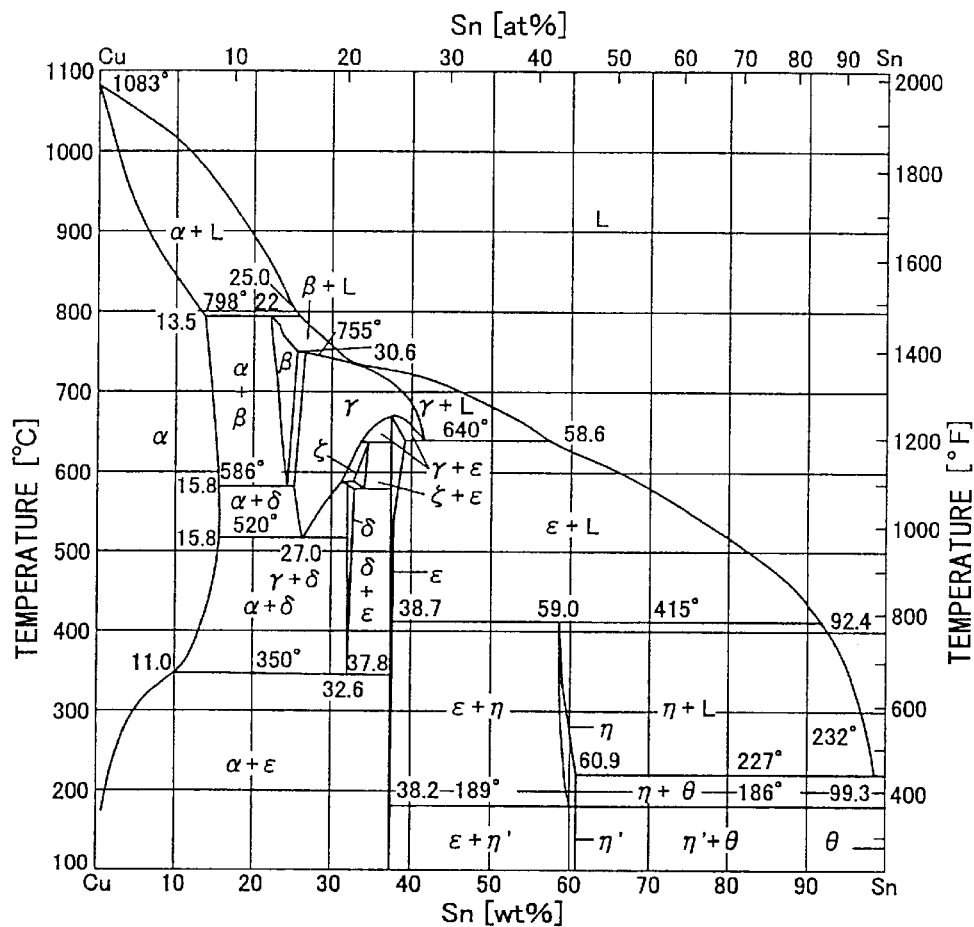
FIG. 5 is a view for showing a phase-diagram of the Sn—Cu system.

FIG. 5 is a view for showing a phase-diagram of the Sn—Cu system.

Referring to FIG. 5, the Sn—Cu alloy has an eutectic temperature of 227° C. and a Cu content of 0.7 mass %. A further increase of the Cu content will dramatically increase the melting point.

With respect to the test materials (a)–(e), the solder alloys are melted at a temperature of 215° C. As shown in TABLE. 4, the Cu whose amount extremely exceeds the above-mentioned eutectic composition (Sn-0.7 Cu), that is Cu having an amount exceeding a solution limitation amount of the Cu in the Sn—Cu alloy particles, is mixed into the solder paste of these test materials (a)–(d).

As a result of this, the Cu or the Cu—Sn particles 23 do not melt even if the solder alloy particles 22 melt, and thereby the Cu or the Cu—Sn particle 23 remains in the solder alloy layer 22A without melting. That is, the Cu, having an amount exceeding an amount of a solution limitation amount in the Sn—Cu alloy particles, is included in the solder paste.

Accordingly, with respect to the solder bonding part in this embodiment, when the Zn in the solder alloy layer 22A transfers in solid phase diffusion, the Zn is caught by the metal particles 23 which were not melted. Hence, the Zn could not reach the Cu wiring pattern 21A and it is decreased that Zn—Cu compound layer 21A grows.

Figure 6:
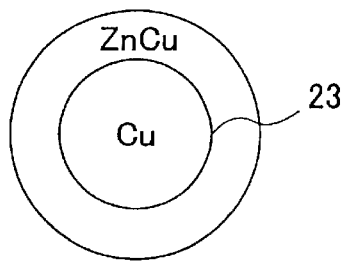
FIG. 6 is a cross sectional view of a metal particle in a soldering part.

FIG. 6 is a cross sectional view of the metal particles 23 in the solder alloy layer 22A in a state where an experiment shown in FIG. 4 is completed.

As shown in FIG. 6, the metal particles 23 in the solder alloy layer 22A had a substantially sphere configuration and the Zn—Cu compound layers were formed around the metal particles 23 thick. The metal particles 23 caught the Zn in the solder alloy particles 22, thereby such Zn—Cu compound layer was formed. The Zn combined with the Sn leads to reduce a melting point of the solder alloy. Hence, there was no obstacle even if the Zn was eliminated after the soldering was completed.

Figure 7:
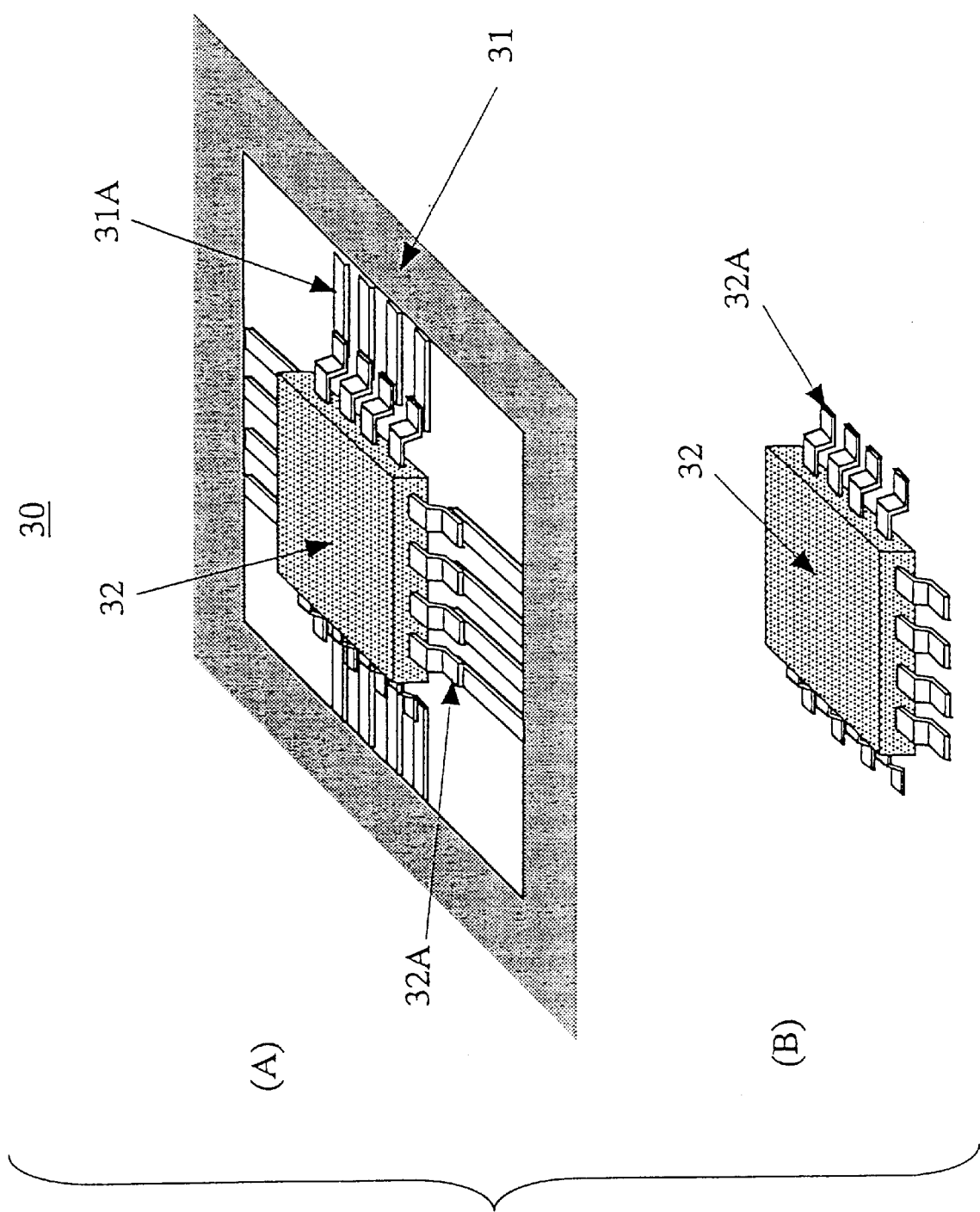
FIG. 7 is a view for showing an electric device having a surface mount type semiconductor package according to the second embodiment of the present invention.

FIG. 7 is a view for showing an electronic device 30 having a surface mount type semiconductor package according to the second embodiment of the present invention.

Referring to FIG. 7-(A), an electronic device 30 includes a wiring substrate 31 and a semiconductor package 32 bonded on the wiring substrate 31. Cu wiring patterns 31A are formed on the wiring substrate 31.

In this embodiment, corresponding to the Cu wiring pattern 31A, a solder paste which is one of the (a) to (e) in TABLE 4 is applied by screen-printing. A semiconductor device having a flatness configuration as shown in FIG. 7-(B) and terminals 32A provided on side surfaces are mounted on the solder paste. The solder alloy particles 22 in the solder paste are melted by heating the electric device 30, so that the terminal 32A is soldered with a corresponding wiring pattern.

In this embodiment, the above-mentioned compositions of (a)–(e) in TABLE 4 are utilized as a solder paste, and thereby the growing of the Zn—Cu composition layer 21A is decreased as shown in FIG. 4. Hence, the bonding strength of the solder part can keep having stability for a long period of time, so that reliability and termination of the electric device 30 according to this embodiment is improved.

Figure 8:
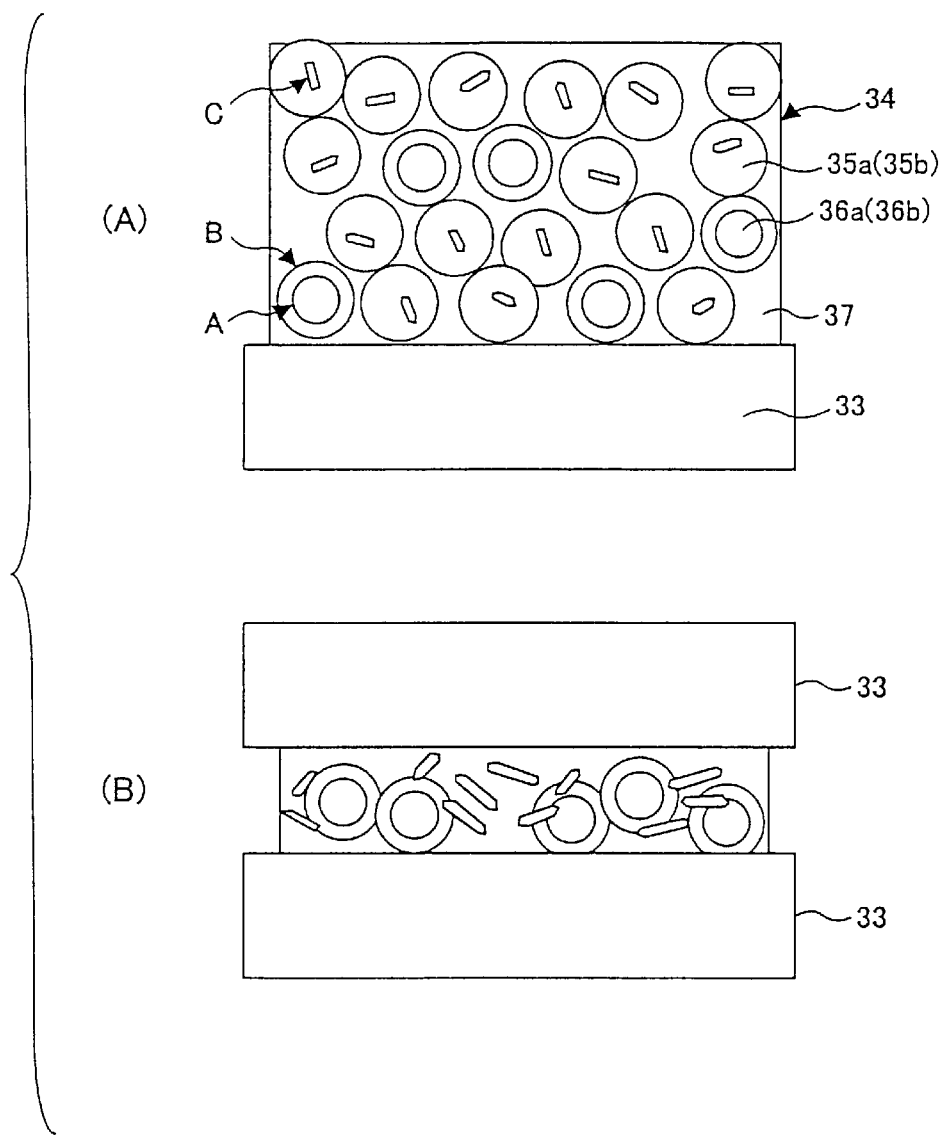
FIG. 8 is a view for explaining a soldering process according to the third embodiment of the present invention.

FIG. 8 is a view for explaining a soldering process according to the third embodiment of the present invention.

Referring to FIG. 8-(A), a solder paste 34 is printed on a Cu block 33 for tensile test by a metal mask. Two kinds of solder particles (alloy particles, alloy) 35a and 35b shown in TABLE 5, two kinds of metal particles 36a and 36b shown in TABLE 6, and a flux 37 shown in TABLE 7 are utilized for the solder paste in this embodiment. Besides, one of two kinds of mixed particles having a same numeral in TABLE 5 and TABLE 6 is utilized for the solder paste. Compositions of two kinds of the solder pastes (solder paste materials) (g) and (h) are shown in TABLE 8.

TABLE 5

| Solder Particles Including Sn and Zn | | |
|---|---|---|
| No. | Composition (mass %) | Melting Point (° C.) |
| 1 | Sn-9Zn | 199 |
| 2 | Sn-8Zn-3Bi | 193 |

TABLE 6

Metal Particles Including an Element in IB group (mass %)

| No. | Surface Part | Core Part |
|---|---|---|
| 1 | Sn Plating | Sn-40Cu |
| 2 | Sn-5Cu Plating | Sn-30Cu |

TABLE 7

Ingredient of Flux

| Rosin | 60 Mass Part |
|---|---|
| Solvents | 36 Mass Part |
| Thixotropic Agents | 3 Mass Part |
| Activators | 1 Mass Part |

TABLE 8

Composition of Solder Paste

| (g) | Sn-9Zn Solder Particles | 80 Mass Part |
|---|---|---|
|  | Sn Plating/ Sn-40Cu Metal Particles | 8 Mass part |
|  | Ingredient of Flux | 12 Mass part |
| (h) | Sn-8Zn-3Bi Solder Particles | 80 Mass Part |
|  | Sn-5Cu plating/ Sn-30Cu metal Particles | 8 Mass part |
|  | Ingredient of Flux | 12 Mass part |

The metal particles 36a or 36b has a structure of No. 1 of TABLE 6 in which Sn is plated, as shown in part B in FIG. 8-(A), on a surface of a core part (part A in FIG. 8-(A)) made of Sn-40 Cu. The metal particles 36a or 36b alternatively has a structure of No. 2 of TABLE 6 in which Sn-5 Cu is plated, as shown in part B in FIG. 8-(A), on a surface of a core part (part A in FIG. 8-(A)) made of Sn-30 Cu. The metal particles may have another structure, instead of the above-described structures formed by stacking a layer such as plating. For instance, the metal particles may have a structure having a density grade of Cu. This structure can be formed by heating, diffusing the metal between respective layers after stacking a layer such as plating, and vanishing an interface of the respective layers substantially. The solder particles 35a or 35b in FIG. 8-(A) schematically shows a state in which the solder particles 35a and 35b include a crystal grain of Zn shown in FIG. 8-(A) as part C.

After two Cu blocks on which the solder paste was printed as shown in FIG. 8-(A) were manufactured, the two Cu blocks were heated at a temperature of 215° C. in a state where solder paste sides of the Cu blocks were confronted. As shown in FIG. 8-(B), after a solder particle were melted and joined, a tensile test specimen was completed to be manufactured.

In this state, the solder particles 35a or 35b were melted. The melted Zn reacts with Cu in the Cu block 33 thereby Zn—Cu compound layers were formed inevitably. Besides, the Zn—Cu compound layers grow by solid-phase-diffusion of Zn, after the solder became solid. Furthermore, the crystal grain of Zn was caught by metal particles as shown in FIG. 8-(B), thereby Zn—Cu compound layers were decreased to grow in this embodiment as well as in the first embodiment.

In order to compare with the solder pastes (g) and (h), tensile test specimens were manufactured by utilizing solder pastes (solder paste materials) (i) and (j) respectively having a composition shown in TABLE 9.

TABLE 9

Composition of Solder Paste

| (i) | Sn-8Zn-3Bi Particles | 88 Mass Part |
|---|---|---|
|  | Ingredient of Flux | 12 Mass part |
| (j) | Sn-8Zn-3Bi Particles | 80 Mass Part |
|  | Pure Cu Metal Particles | 8 Mass part |
|  | Ingredient of Flux | 12 Mass part |

As a result of the tensile test concerning the respective tensile test specimens utilizing the solder pastes (g) and (h), a bonding strength of $8.8*10^7$ N/m$^2$ and more was obtained, as well as the bonding strength of the tensile test specimens utilizing the solder paste (i) not including metal particles. On the other hand, the tensile test specimen utilizing the solder paste (j) including the pure Cu metal particles had the bonding strength of only $6.8*1$ N/m$^2$, while the solder paste (j) had substantially same effect as the first embodiment with respect to the thickness of the Zn—Cu compound layer.

Furthermore, a tensile test was carried out after the above-mentioned respective tensile test specimens were left for 100 hours in a constant temperature bath having a temperature of 150° C. According to the result of the test, the tensile test specimens using solder pastes (g) and (h) had no change with regard to the bonding strength. However, the tensile test specimens using the solder paste (i) had an effect of great reduction of the bonding strength.

This was because pure Cu metal particles are mixed into a solder part of the tensile test specimen utilizing the solder paste (j) which mix-included pure Cu metal particles, and thereby the wetting between the solder and metal particles were not sufficient to some extent. Hence, the initial bonding strength was reduced. As described above, when the test specimen for tensile test using the solder paste (i) was kept having a temperature of 150° C., the connecting strength was greatly reduced in this embodiment as well as in the first embodiment. This was because the heat stress promotes the solid-phase-diffusion of Zn (Zn crystal grain) as described about the conventional art, and thereby the thickness of the Zn—Cu compound layer was increased.

On the other hand, test specimens for tensile test which utilized the solder paste (g) and (h) had sufficient wetting with respect to the solder and the metal particles. In the test specimen using the solder paste (g), Cu was not employed on the surface layer and a layer of only Sn was plated. In the test specimen using the solder paste (h), the density of Cu in a surface side was lower than in a center side. Besides, the initial bonding strength was not reduced because the metal particles caught Zn even at the time of that heat stress was applied. Furthermore, the bonding strength was not reduced, on the basis of time passing and growing the Zn—Cu compound layer, and thereby the connecting part having a high reliability could be achieved.

The soldering process in the third embodiment can be applied to the electric device of the second embodiment as well as the first embodiment can be applied to the electric device of the second embodiment.

The present invention is not limited to these embodiments, but various variations and modifications may be made without departing from the scope of the present invention.

This patent application is based on Japanese priority patent application No. 2000-361873 filed on Nov. 28, 2000 and No. 2001-256218 filed on Aug. 27, 2001, the entire contents of which are hereby incorporated by references.

What is claimed is:

1. A solder paste, comprising:

a flux;

a solder alloy particle scattered or mixed in the flux and including Sn and Zn as composition elements; and a metal particle scattered or mixed in the flux and including an element in the IB group in the periodic table as a composition element.

2. The solder paste as claimed in claim 1, wherein the composition element of the metal particle is Cu.

3. The solder paste as claimed in claim 1, wherein metal particle includes the element in the IB group which has an amount exceeding a solution limitation amount of the element in the alloy particle at soldering.

4. The solder paste as claimed in claim 1, wherein the metal particle has a center and a surface, and has a density grade of the element in the IB group from the center to the surface.

5. The solder paste as claimed in claim 1, wherein the metal particle is formed by successively forming a plurality of layers which respectively have different densities of the element in the IB group.

6. The solder paste as claimed in claim 4, wherein the metal particle has densities of a surface side and a center side of the element in the IB group and the density of the surface side of the element in the IB group is lower than the density of the center side.

7. The solder paste as claimed in claim 1, wherein the metal particle further includes a metal element other than the element in the IB group, said metal element forming a surface layer on the surface of the metal particle.

8. The solder paste as claimed in claim 7, wherein the metal element forming the surface layer on the surface of the metal particle is Sn.

9. The solder paste as claimed in claim 1, wherein the metal particle has a diameter of 5 $\mu$m or more.

10. The solder paste as claimed in claim 1, wherein the solder alloy particle has a diameter of between 20 $\mu$m and 40 $\mu$m.

11. The solder paste as claimed in claim 1, wherein the element in the IB group is selected from a group consisting of Cu, Au, and Ag.

12. An electronic device, comprising:

a terminal of which at least a surface is made of Cu; and a solder layer covering the terminal and comprising:

a solder alloy including Sn and Zn as composition elements, and a particle having a diameter of 5 $\mu$m or more and including an element in the IB group as a composition element.

13. The electronic device as claimed in claim 12, wherein the particle includes a center and a surface and has a density grade of the element in the IB group from the center to the surface.

14. The electronic device as claimed in claim 12, wherein the particle is formed by successively forming a plurality of layers which respectively have different densities of the element in the IB group.

15. The electronic device as claimed in claim 13, wherein the particle has densities of a surface side and a center side of the element in the IB group and the density of the surface side is lower than the density of the center side.

16. The electronic device as claimed in claim 12, wherein the particle has a metal element other than the element in the IB group, which forms a surface layer on the surface of the particle.

17. The electronic device as claimed in claim 12, wherein the particle has a substantially spherical configuration.

18. The electronic device as claimed in claim 12, wherein the element in the IB group is selected from a group consisting of Cu, Au, and Ag.

19. The electronic device as claimed in claim 12, wherein the terminal is plated by Cu.

20. The electronic device as claimed in claim 12, wherein the solder alloy includes Zn of approximately 8 mass % and Bi of approximately 3 mass %.

21. The electronic device as claimed in claim 12, wherein the solder alloy includes the element in the IB group which has a solution limitation amount of the element in the alloy.

* * * * *